United States Patent
Dwilinski et al.

(10) Patent No.: US 7,314,517 B2
(45) Date of Patent: *Jan. 1, 2008

(54) PROCESS FOR OBTAINING BULK MONO-CRYSTALLINE GALLIUM-CONTAINING NITRIDE

(75) Inventors: Robert Dwilinski, Warsaw (PL); Roman Doradzinski, Warsaw (PL); Jerzy Garczynski, Lomianki (PL); Leszek Sierzputowski, Union, NJ (US); Yasuo Kanbara, Anan (JP)

(73) Assignees: Ammono Sp. Z.O.O., Warsaw (PL); Nichia Corporation, Tokushima (JP)

( * ) Notice: Subject to any disclaimer, the term of this patent is extended or adjusted under 35 U.S.C. 154(b) by 135 days.

This patent is subject to a terminal disclaimer.

(21) Appl. No.: 10/538,349

(22) PCT Filed: Dec. 11, 2003

(86) PCT No.: PCT/JP03/15903

§ 371 (c)(1),
(2), (4) Date: Jun. 10, 2005

(87) PCT Pub. No.: WO2004/053208

PCT Pub. Date: Jun. 24, 2004

(65) Prior Publication Data

US 2006/0120931 A1 Jun. 8, 2006

(30) Foreign Application Priority Data

Dec. 11, 2002 (PL) .................................... 357695
Dec. 11, 2002 (PL) .................................... 357704
Dec. 11, 2002 (PL) .................................... 357706

(51) Int. Cl.
*C30B 11/12* (2006.01)

(52) U.S. Cl. .............................. 117/76; 117/81; 117/83; 117/937

(58) Field of Classification Search .................. 117/76, 117/81, 83, 937
See application file for complete search history.

(56) References Cited

FOREIGN PATENT DOCUMENTS

| FR | 2796657 | 1/2001 |
|---|---|---|
| WO | WO97/13891 | 4/1997 |
| WO | WO02/101120 | 12/2002 |
| WO | WO03/035945 | 5/2003 |

OTHER PUBLICATIONS

L. Liu et al.; "Substrates for gallium nitride epitaxy" Materials Science and Engineering R 37, Apr. 30, 2002, pp. 61-127.

*Primary Examiner*—Felisa Hiteshew
(74) *Attorney, Agent, or Firm*—Westerman, Hattori, Daniels & Adrian, LLP.

(57) ABSTRACT

An improved mineralizer used for a process for obtaining bulk mono-crystalline gallium-containing nitride of a general formula of $Al_xGa_{1-x}N$, where $0 \leq x < 1$ in an environment of supercritical ammonia-containing solution has been now proposed. According to the invention growth rate and quality of the product obtained can be controlled by suitable selection of mineralizer, so as to ensure presence of ions of Group I element (IUPAC 1989), preferably sodium in combination with other components selected from the group consisting of Group I elements (IUPAC 1989), ions of Group II elements (IUPAC 1989), one or more substances containing oxygen-free species causing some weakening of the ammono-basic nature of the supereritical solvent, optionally in combination with Group II elements (JUPAC 1989), preferably calcium or magnesium.

9 Claims, 6 Drawing Sheets

US 7,314,517 B2

PROCESS FOR OBTAINING BULK MONO-CRYSTALLINE GALLIUM-CONTAINING NITRIDE

FIELD OF THE INVENTION

The present invention relates to an improved process for obtaining bulk mono-crystalline gallium-containing nitride, in which bulk Group XIII (Group numbering according to the IUPAC convention of 1989 throughout this application) element(s) nitride mono-crystals are grown in an environment of supercritical ammonia-containing solution. The improved process and the bulk mono-crystals obtained thereby are intended mainly for use in the field of opto-electronics. The proposed improvement relates to a selection of a mineralizer used in the process.

BACKGROUND OF THE INVENTION

Known opto-electronic devices are based on use of Group XIII element(s) nitrides such as AlN, GaN and InN and mixed Group XIII element nitrides containing two or three Group XIII elements. Such nitrides have thus far been commercially manufactured on sapphire or silicon-carbide substrates, differing in nature and structure from the thereafter deposited nitride layers (heteroepitaxy) using such methods as MOCVD, HVPE, MBE and others.

Numerous attempts have thus far been made to develop other methods for obtaining bulk mono-crystalline Group XIII element(s) nitride, in particular bulk mono-crystalline gallium nitride and reported in the number of papers and disclosed in various patents or patent applications.

Bulk mono-crystals of gallium-containing nitrides have recently been obtained form the supercritical ammonia-containing solution of soluble precursors of such nitrides by selective crystallization on crystallization seeds as described in WO 02/101120. Further improvements in the proposed technology have been reported in WO 03/035945.

In the environment of supercritical ammonia-containing solution a dynamic equilibrium between fluid and solid phase can be achieved and controlled so that relatively thick layers of desired gallium-containing nitrides can be deposited on the seeds.

It has been proven in the course of further studies on the process parameters, that the growth rate, purity, crystalline quality and surface quality of the bulk mono-crystalline Group XIII element(s) nitride(s) depend on a number of factors and can be easily distorted by inadequate control of the process parameters.

Surprisingly, it has been discovered that the results achieved in terms of growth rate and quality of the product depend also on the composition of the supercritical ammonia-containing solution, in particular on the composition and concentration of a mineralizer used as a component of such a solution.

Thus, it is a main object of the present invention to provide an improved process for obtaining bulk mono-crystalline gallium-containing nitride(s) suitable for commercial exploitation, in which the product obtained thereby can have desired, properly balanced crystalline and surface properties.

It is also the aim of the present invention to provide means for control of solubility of the starting material used as a feedstock containing Group XIII element(s), in particular gallium.

Still further aim of the invention is to provide means for control of growth rate of Group XIII element(s) nitride mono-crystals, while ensuring the required quality of the obtained crystals, enabling use of the same in various opto-electronic devices. In this aspect of the invention elimination of oxygen impurities is of a particular importance.

SUMMARY OF THE INVENTION

The aims of the present invention have been achieved by developing an improved process for obtaining bulk gallium-containing nitride mono-crystals as defined in the appended claim 1.

The process for obtaining bulk mono-crystalline gallium-containing nitride in the supercritical ammonia-containing solvent with mineralizer addition, according to the present invention, is characterized in that a supercritical ammonia-containing solvent, containing ions of Group I element, preferably sodium and:

(a) ions of another Group I element, or
(b) ions of Group II element, preferably calcium or magnesium, or
(c) one or more substances containing oxygen-free species causing a weakening of the ammono-basic nature of the supercritical solvent, or else
(d) ions of Group II element, preferably calcium or magnesium and one or more substances containing oxygen-free species causing a weakening of the ammono-basic nature of the supercritical solvent is obtained in the autoclave and then this solvent is used for dissolution of the gallium-containing feedstock, and crystallization of the gallium-containing nitride is obtained from the supercritical solution on the surface of the seed at the temperature higher and/or pressure lower than that of dissolution of the feedstock.

The process of obtaining bulk mono-crystalline gallium-containing nitride, according to the present invention, is characterized in that the gallium containing nitride has a negative temperature coefficient of solubility in the supercritical ammonia-containing solvent obtained in the autoclave with the use of Group I element, preferably sodium and:

(a) ions of another Group I element, or
(b) ions of Group II element, preferably calcium or magnesium, or
(c) one or more substances containing oxygen-free species causing a weakening of the ammono-basic nature of the supercritical solvent, or else
(d) ions of Group II element, preferably calcium or magnesium and one or more substances containing oxygen-free species causing a weakening of the ammono-basic nature of the supercritical solvent which is used for dissolution of the gallium-containing feedstock, two temperature zones are created within the autoclave, the feedstock is put in the dissolution zone, while at least one mono-crystalline seed is placed in the crystallization zone, and then, at least in the autoclave zone, wherein the seed was placed, supersaturation of the solution with respect to the seed occurs as a result of proper increasing temperature of said zone and crystallization of the gallium-containing nitride is carried out on the surface of the seed through control of concentration at the level at which spontaneous crystallization is negligible.

The process according to the invention as described above, is further characterized in that said supercritical ammonia-containing solvent is obtained with the use of sodium and another Group I element as mineralizers and the molar ratio of ions of sodium to ions of other Group I element is from 1:10 to 10:1.

The process according to the invention as described above, is further characterized in that the supercritical ammonia-containing solvent contains ions of Group I element and ions of Group II element as mineralizers and the molar ratio of Group II element to the Group I element, introduced together, ranges from 1:500 to 1:5, more preferably from 1:100 to 1:20.

The process according to the invention as described above, is further characterized in that preferably said oxygen-free species contain sulfur.

The process according to the invention as described above, is characterized in that said Group I elements are selected from the group comprising sodium, potassium and lithium.

Preferably, said Group I elements are introduced to the supercritical ammonia-containing solvent in the form of azides.

By the process according to the invention as described above the gallium-containing nitride having a general formula of $Al_xGa_{1-x}N$, where $0 \leq x < 1$ is preferably obtained.

The use of mineralizers modified as indicated above has proven to be a crucial factor in obtaining smooth surface of mono-crystals deposited on the nitride homo-seeds and also in ensuring low surface dislocation density of the mono-crystals obtained.

The results can be attributed to a controlled change of solubility of Group XIII element nitrides in supercritical ammonia-containing solvent in presence of the above defined mineralizers, which in turn depends also on a relative molar ratio of the individual mineralizer components used, as well as the molar ratio of the total mineralizer composition to ammonia and Group XIII element nitrides.

Further advantage resulting from adoption of the process according to the present invention is that the bulk gallium-containing nitride mono-crystals obtained have at least one surface suitable for epitaxial growth of semiconducting nitride layers without any additional pre-treatment, the surface being a C-plane or more preferably non-polar A-plane or M-plane of the hexagonal wurzite type lattice of the Group XIII element(s) nitride(s).

The big advantage of the process according to the present invention is also such, that the surface dislocation density of the thus obtained bulk mono-crystals may be orders of magnitude lower than the dislocation density of the seeds used.

BRIEF DESCRIPTION OF THE FIGURES

The accompanying Figures illustrate the present invention and

DETAILED DESCRIPTION OF THE INVENTION

Figure 1:
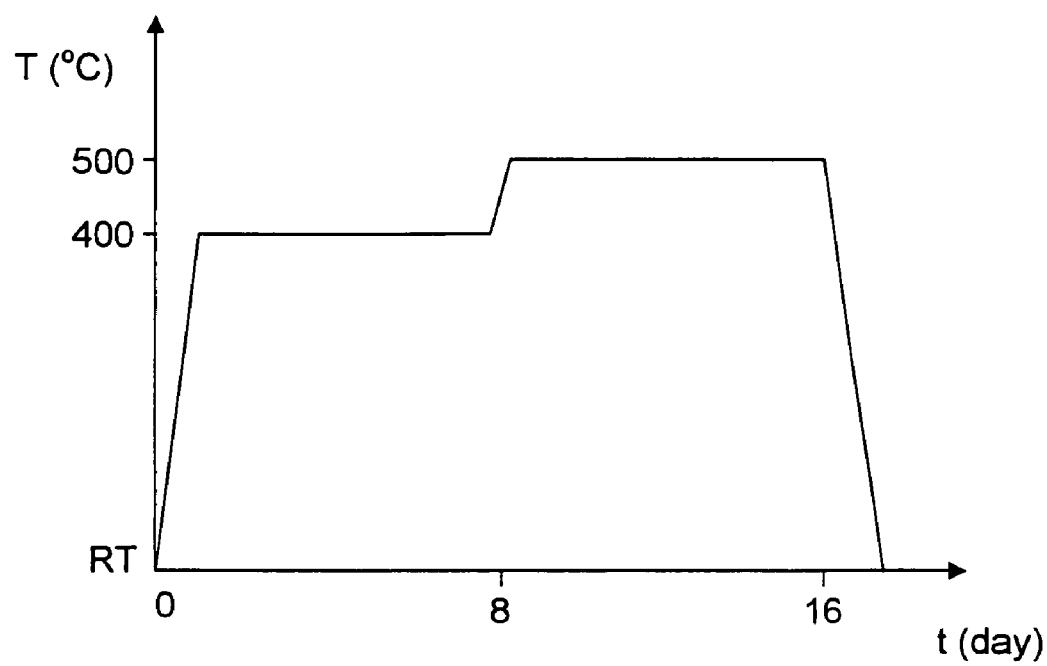
FIG. 1 shows the change of temperature in time inside the autoclave at a constant pressure and illustrates the relation between the change of the temperature and dissolution and crystallization steps in the process according to the present invention.

The invention provides methods of advanced control over both process parameters and properties of the product obtained thereby.

In the present invention the following definitions apply:

Group XIII element(s) nitride means a nitride of Group XIII element(s), i.e. aluminum, gallium and indium either alone or in any combination. Gallium-containing nitride is the most preferred such nitride.

Gallium-containing nitride means a nitride of gallium and optionally other element(s) of Group XIII. It includes, but is not restricted to, the binary compound—GaN, a ternary compound—AlGaN, InGaN or a quaternary compound AlInGaN, preferably containing a substantial portion of gallium, anyhow at the level higher than dopant content. The composition of other elements with respect to gallium may be modified in its structure insofar as it does not collide with the ammono-basic nature of the crystallization technique. (The mentioned formulas are only intended to give the components of the nitrides. They are not intended to indicate their relative amounts.)

Bulk mono-crystal of gallium-containing nitride means a mono-crystal—especially for use as a substrate for epitaxy—made of gallium-containing nitride, to be used in the process for manufacturing various opto-electronic devices such as LED or LD, which can be formed by epitaxial methods, such as MOCVD and HVPE, wherein the thickness of the mono-crystal is preferably at least 1 mm, more preferably at least 3 mm.

C-, A- or M-plane refers to C-, A- or M-plane surfaces of hexagonal Group XIII element nitride crystals.

Precursor of gallium-containing nitride is a substance or a mixture containing at least gallium, which may also contain Group I elements, elements of Group XIII, nitrogen and/or hydrogen, and metallic gallium, its alloys or metallic compounds, hydrides, amides, imides, amido-imides and azides, which may form gallium compounds soluble in the supercritical ammonia-containing solvent as defined below.

Gallium-containing feedstock is gallium-containing nitride or its precursor. Feedstock can be in the form of GaN obtained by any method, e.g. flux methods, HNP method, HVPE method, or polycrystalline GaN obtained in situ from metallic gallium as the result of a chemical reaction in the supercritical ammonia-containing solvent.

Supercritical ammonia-containing solution is a supercritical solvent consisting at least of ammonia, which contains one or more types of ions of Group I elements, used for dissolution of gallium-containing feedstock. The supercritical ammonia-containing solvent may also contain derivatives of ammonia and/or their mixtures, in particular—hydrazine.

Mineralizer is generally a substance introducing into the supercritical ammonia-containing solution one or more Group I and optionally Group II element ions optionally in combination with oxygen-free species causing a weakening of ammono-basic nature of the supercritical solution, affecting dissolution of a feedstock and gallium containing nitride.

Substances containing oxygen-free species causing a weakening of ammono-basic nature of the supercritical solution are selected from the group which includes:
a) compounds $A_mB_n$, where A means $H^+$ and/or metal, preferably Group I element, $NH_4^+$, Si, S, P, whereas B means halogens, S, P, and n and m mean corresponding stoichiometric coefficients not lower than 1, and/or
b) groups of species such as:
$S_4N_4$, $S_2N_2$, SN, $S_4N_2$, $S_{11}N_2$, $P_3N_5$, $P_4N_6$, PN, $PN_2^-$, $PN_3^{4-}$, $PN_4^{7-}$, $PN^-$, $PN^{2-}$,
$PNCl_2$, $P(NH)_2NH_2$, $P_4S_{10}$, $NP(SNH_4)_2$, $NPSNH_4SH$, $NP(SH)_2$, PNS, Sulfur or silicon species built in the crystalline lattice of the gallium-containing nitride serve as donors; magnesium, zinc or cadmium are acceptors; dopants such as manganese or chromium in the crystalline gallium nitride lattice provide it with magnetic properties; whereas phosphor atoms are isoelectronic with respect to nitrogen atoms, and thus they make the energy gap narrower than that in the pure gallium-containing nitride. Those species do not only cause the weakening of ammono-basic nature of the supercritical solvent, but they also modify optical, electrical and magnetic properties of the gallium-containing nitride.

Dissolution of gallium-containing feedstock is a reversible or irreversible process of formation, through the feedstock, of gallium compounds soluble in the supercritical solvent, for example gallium complexes. Gallium complexes are chemical complex compounds, in which centrally placed gallium atom is surrounded by $NH_3$-type ligands or their derivatives, such as $NH_2^-$, $NH_2^-$.

Supercritical solution means a solution obtained as a result of dissolution of the gallium-containing feedstock in the supercritical ammonia-containing solvent.

Solubility: Our experiences show that equilibrium may be achieved between the solid, which is gallium-containing nitride, and the supercritical solution at sufficiently high temperature and pressure. Therefore, solubility of gallium-containing nitride may be defined as the equilibrium concentration of soluble gallium compounds obtained in the above mentioned process of dissolution of gallium-containing nitride. In this process, the equilibrium concentration, i.e. solubility, may be controlled by modifying the composition of the solvent, temperature and/or pressure.

Figure 2:
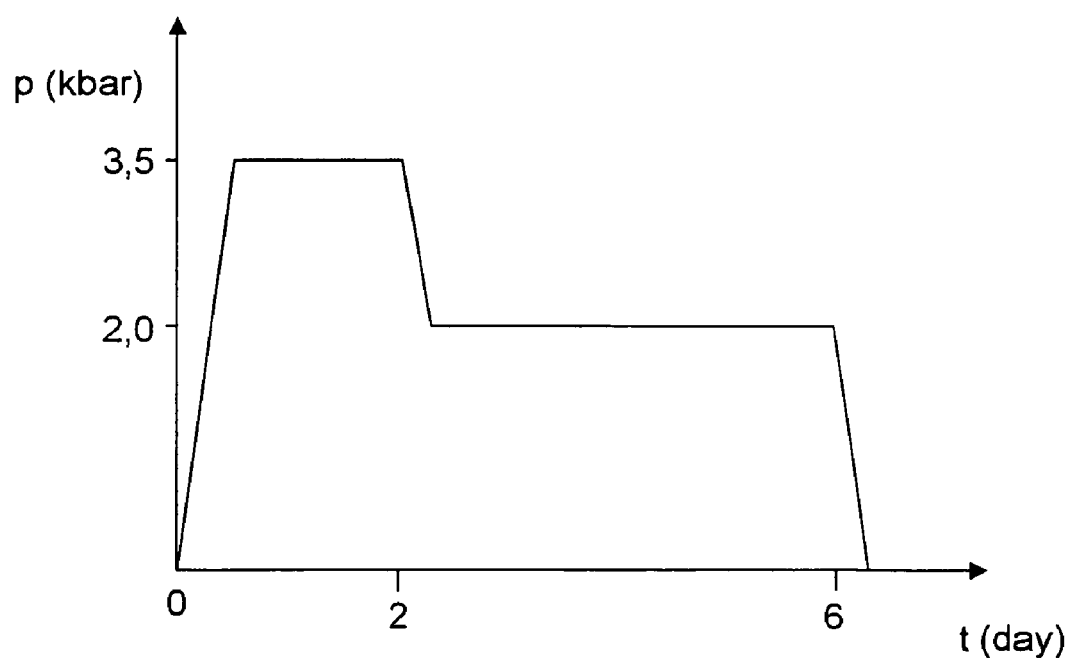
FIG. 2 presents the change of pressure in time inside the autoclave at constant temperature and illustrates the relation between the change of the pressure and dissolution and crystallization steps in the process according to the present invention.

Negative temperature coefficient of solubility (negative TCS) means that the solubility of the respective compound is a monotonically decreasing function of temperature if all the other parameters are kept constant. Similarly, positive pressure coefficient of solubility (positive PCS) means that, if all the other parameters are kept constant, the solubility is a monotonically increasing function of pressure. In our research we have shown that the solubility of gallium-containing nitride in supercritical ammonia-containing solvent possesses a negative temperature coefficient and a positive pressure coefficient in temperature ranging at least from 300° C. to 550° C. and pressure from 100 to 550 MPa. This means that in accordance to FIG. 1, after dissolution of feedstock in an autoclave kept for 8 days at the temperature 400° C. (i.e. after dissolution step) re-crystallization of gallium nitride may be achieved by increasing the temperature inside the autoclave to 500° C., while keeping constant pressure of 200 MPa (crystallization step). On the other hand, as shown in FIG. 2, after dissolution of a feedstock at increased pressure in an autoclave kept for 2 days at the level of 350 MPa (i.e. after dissolution step), re-crystallization of gallium nitride is achieved by means of reducing the pressure to 200 MPa while keeping constant temperature of 500° C. (crystallization step).

Supersaturation: If concentration of soluble gallium compounds in the supercritical ammonia-containing solution is higher than solubility of gallium-containing nitride in specific physico-chemical conditions, then the supersaturation of the supercritical ammonia-containing solution with respect to gallium-containing nitride in those conditions can be defined as the difference between the actual concentration and the solubility. While dissolving gallium-containing nitride in a closed system it is possible to obtain the supersaturation state, for example, by increasing temperature or decreasing pressure.

Chemical transport of gallium-containing nitride in the supercritical ammonia-containing solution is a continuous process involving dissolution in the supercritical solution of the gallium-containing feedstock, transport of soluble gallium compounds through the supercritical solution, as well as crystallization of the gallium-containing nitride from the supersaturated supercritical solution. Generally, the chemical transport can be caused by the difference in temperature, difference in pressure, difference in concentration, or other chemical or physical differences between the feedstock being dissolved and the crystallization product. Due to the process according to the invention, it is possible to obtain bulk mono-crystalline gallium-containing nitride as a result of the chemical transport in the conditions of temperature difference, yet it is necessary to maintain higher temperature in the crystallization zone than in the dissolution zone. According to the invention, the chemical transport is preferably caused by convection.

Seed, as it has already been mentioned, is crucial for obtaining desired bulk gallium-containing nitride mono-crystals in a process according to the present invention. In view of the fact that the quality of the seed is crucial for the crystalline quality of the bulk gallium-containing nitride mono-crystals obtained by the process according to the present invention, the seed selected for the process should have possibly high quality. Various structures or wafers having a modified surface can also be used. For example a structure having a number of surfaces spaced adequately far from each other, arranged on a primary substrate and susceptible to the lateral overgrowth of crystalline nitrides may be used as a seed. Moreover, a seed having a homoepitaxial surface, exhibiting n-type electrical conductivity, for example doped with Si, may be used. Such seeds can be produced using processes for gallium-containing nitride crystal growth from gaseous phase, such as HVPE or MOCVD, or else MBE. Doping with Si during the growth process at the level of $10^{16}$ to $10^{21}/cm^2$ ensures n-type electric conductivity. Moreover, a composite seed may be used and in such seed directly on a primary substrate or on a buffer layer made for example of AlN—a layer made of GaN doped with Si may be deposited. Furthermore, for a particular future use, bulk mono-crystals can be grown by the process according to the present invention on homo-seeds having a defined orientation with respect to hexagonal wurzite type crystallographic lattice of the specific Group XIII element(s) nitride, such as C-plane, A-plane or M-plane of the respective nitride.

Spontaneous crystallization from the supersaturated supercritical ammonia-containing solution means any undesirable process of nucleation and growth of the gallium-containing nitride crystals taking place at any site within the autoclave except on the surface of the seed. The definition also includes growth on the surface of the seed, in which the grown crystal has the orientation different from that of the seed.

Selective crystallization on the seed means the process of crystallization taking place on the surface of the seed in the absence of spontaneous crystallization, but also when spontaneous crystallization occurs in negligible degree. This process is indispensable to obtain bulk mono-crystal and, at the same time, it is one of the elements of this invention.

Temperature and pressure of the reaction: In the examples presented in the specification, temperature profile inside the autoclave was measured with use of an empty autoclave, thus without supercritical ammonia-containing solution. Therefore, these are not real temperatures of the process carried out in supercritical conditions. Pressure was measured directly or calculated on the basis of physico-chemical data of ammonia-containing solvent for the assumed temperature of the process and autoclave volume.

MOCVD Method (Metallo-Organic Chemical Vapor Deposition) means the process of deposition of epitaxial layers from a gaseous phase, in which ammonia and metallo-organic gallium compounds are used as substrates in the case of gallium nitride.

HVPE Method (Halide Vapor Phase Epitaxy) means the process of deposition of epitaxial layers from a gaseous phase, in which metallic halides and ammonia are used as reagents in the case of nitrides.

Figure 4:
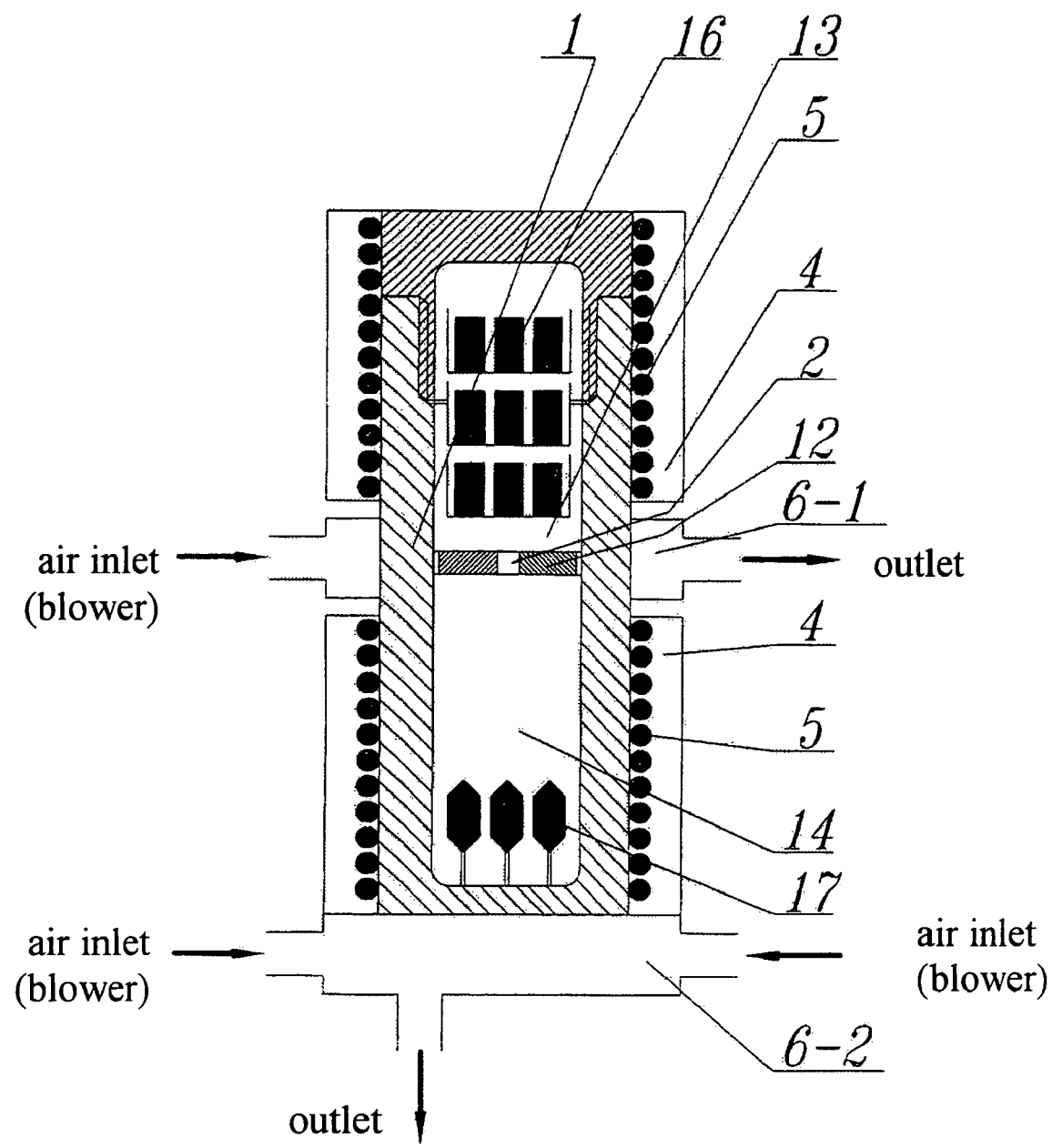
FIG. 4 shows a schematic axial cross section of an autoclave and a set of furnaces, as used to run the process according to the present invention.
Figure 5:
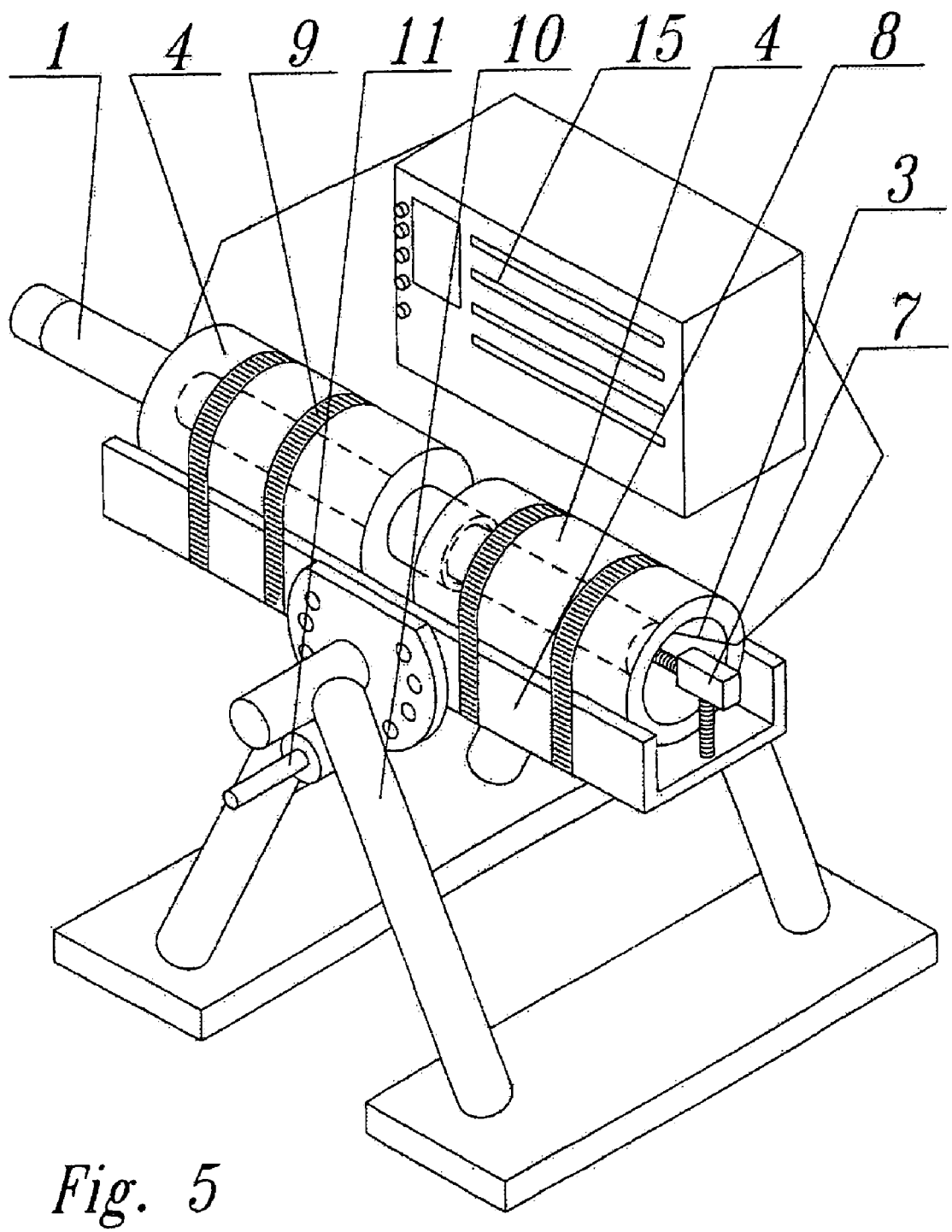
FIG. 5 presents a schematic perspective view of an apparatus used to run the process according to the present invention.

Autoclave means a closed and pressurized reaction vessel, which has a reaction chamber where the ammonobasic process according to the present invention is carried out. Any suitable autoclave can be used, however in the examples illustration the present invention the apparatus as shown schematically in FIG. 4 and FIG. 5 was used. Detail description of the autoclave is provided further below.

Proper selection of a mineralizer in the process according to the present invention influences both dissolution rate of the gallium-containing feedstock and its solubility. Thus, it affects the concentration of the soluble forms of Group XIII element(s)—gallium in particular, in the solution.

The present invention is directed to an improved process for obtaining bulk mono-crystalline gallium-containing nitride in a supercritical ammonia-containing solvent comprising mineralizer, wherein gallium-containing feedstock and crystallization seeds are in contact with the ammonia-containing solution and the ammonia-containing solution contains as a mineralizer Group I element ions, preferably sodium ions in combination with:
(a) ions of another Group I element—potassium or lithium, or both; or
(b) ions of Group II element, preferably calcium or magnesium, or both; or
(c) one or more substances containing oxygen-free species causing a weakening of the ammono-basic nature of the supercritical solvent, or else
(d) ions of Group II element, preferably calcium or magnesium and one or more substances containing oxygen-free species causing a weakening of the ammono-basic nature of the supercritical solvent and wherein in the process after the solution is brought to the supercritical temperature and pressure in an autoclave, gallium-containing nitride bulk mono-crystals of a desired parameters of purity, crystalline and surface quality are grown on the crystallization seed at the desired growth rate by means of ensuring convection transport of mass from the gallium containing feedstock. The convective mass transport between dissolution and crystallization zones is ensured in the supercritical ammonia containing solution by means of applying temperature gradient and/or pressure change, such that crystallization of the gallium-containing nitride takes place at the temperature higher and/or pressure lower than that of dissolution of the feedstock.

According to the present invention a process is provided for obtaining bulk mono-crystalline gallium-containing nitride having a negative temperature coefficient of solubility in the supercritical ammonia-containing solvent comprising mineralizer, wherein gallium-containing feedstock and crystallization seeds are in contact with the supercritical ammonia-containing solution and the ammonia-containing solution contains as a mineralizer Group I element ions, preferably sodium ions in combination with:
(a) ions of another Group I element, or
(b) ions of Group II element, preferably calcium or magnesium or
(c) one or more substances containing oxygen-free species causing a weakening of the ammono-basic nature of the supercritical solvent, or else
(d) ions of Group II element, preferably calcium or magnesium and one or more substances containing oxygen-free species causing a weakening of the ammono-basic nature of the supercritical solvent and wherein in the process after the solution is brought to the supercritical state in an autoclave, two temperature zones are created within the autoclave, the feedstock is put in the dissolution zone, while at least one mono-crystalline seed is placed in the crystallization zone, and then gallium-containing nitride bulk mono-crystals of a desired parameters of purity, crystalline and surface quality are grown on the crystallization seed at the desired growth rate so that at least in the autoclave zone, where the seed(s) is/are placed, supersaturation of the solution with respect to the seed(s) is ensured as a result of proper increasing temperature of said zone and crystallization of gallium-containing nitride is carried out on the surface of the seed(s) through control of concentration at the level at which spontaneous crystallization is negligible.

Various gallium-containing materials or mixtures thereof can be used as the feedstock in the process of the present invention and the present findings cannot be limited to one specific embodiment of the ammonobasic method for preparing gallium-containing nitride crystals. For example the present invention is applicable to processes as disclosed in WO 02/10112 or WO 03/035945. If necessary, any method based on crystallization of gallium-containing nitride from the supercritical ammonia-containing solution comprising soluble forms of gallium-containing nitride precursors and mineralizer can be improved by the process according to the present invention.

Thus, as feedstock for growth of desired crystals, gallium-containing nitrides or Group XIII metal alloys comprising gallium, individual Group XIII metals, including metallic gallium, as well as combinations thereof are preferably used.

In the process according to the present invention various seeds as explained above can be used, depending on the intended use of the bulk mono-crystalline layer of gallium-containing nitride deposited thereon. It is essential to mention that bulk mono-crystalline gallium-containing nitrides obtained by the process according to the present invention may be used directly or after respective treatment of cutting, polishing, washing, activation of acceptors or stabilizing. Moreover, they can be used as the seeds in different runs of the process of the present invention.

According to this invention, ions of Group I elements and optionally ions of Group II elements, are introduced in the form of metals and/or chemical compounds of those metals and/or their mixtures, which in particular do not contain significant quantities of halogens. Preferably, one or two types of ions of Group I elements are used, from the group comprising $Li^+$, $Na^+$, $K^+$. Particularly, it is preferable to introduce them in the form of Group I elements, hydrides, amides, imides, amido-imides, nitrides or azides of Group I elements in such concentration which, having been introduced, will allow to obtain the molar ratio of Group I elements to ammonia in the range between 1:20 and 1:8. Addition of oxygen-free components causing some weakening of the ammono-basic nature of the resultant supercritical solution is also encompassed by the present invention.

As it was mentioned above, one of the aims of the present invention is to further reduce surface dislocation density of the bulk mono-crystals produced, to ensure good crystallinity of the mono-crystals and reduce concentration of impurities that may adersly affect the properties of the opto-electronic devices for which the products are intended.

In one aspect of the present invention the growth rate of bulk mono-crystalline gallium-containing nitride can be regulated by modifying composition of the mineralizer used, in such a way as to ensure presence of two different Group I element ions in supercritical ammonia-containing solution of soluble forms of Group XIII element(s) during the process of the present invention.

It has been found that the growth rate is changed when beside sodium ions the solution contains also lithium or potassium ions. The growth is faster in presence of sodium and potassium ions and slower when any of them is replaced with lithium.

In another aspect of the present invention the quality of the surface—in particular surface smoothness of bulk mono-crystalline gallium-containing nitride can be regulated by modifying composition of the mineralizer used, in such a way as to ensure presence of both Group I element and Group II element ions in the supercritical ammonia-containing solution during the process according to the present invention.

In still further aspect of the invention, oxygen impurities may be reduced by elimination of very reactive and hygroscopic metallic sodium as a starting material in the process of the invention. In this respect it has been particularly advantageous to use Group I and Group II element azides as mineralizer precursors since they are easy to handle and purify.

The azide mineralizers has turned out to be effective only after decomposition of azide structures which takes place at temperature above 300° C. in the supercritical ammonia-containing solvent and thus the temperature profiles of the process according to the present invention need to be modified accordingly.

Surprisingly, it has been found that the use of azide mineralizers have some impact also on growth rate of the bulk mono-crystalline gallium-containing nitride(s) and cause increase of the growth rate.

When big quantities of azides are introduced, after decomposition thereof it may turn out necessary to at least partially evacuate the autoclave in order to get rid of the decomposition gases and recharge the autoclave with fresh ammonia in order to avoid uncontrolled increase of pressure during the process.

The growth rate can be modified also by introducing as an additional mineralizer one or more substances containing oxygen-free species causing some weakening of the ammono-basic nature of the supercritical solution, optionally in combination with Group II element salt. The oxygen-free species are in particular, introduced in the form of compounds carrying sulfur species: sulfide of Group I element $M_2S$, $H_2S$, $(NH_4)_2S_x$. A preferable example of such a substance is also $PH_3$. The molar ratio of the substances containing oxygen-free species causing a weakening of the ammono-basic nature of the solvent to the Group I element, which is jointly introduced, ranges from 1:100 to 1:10. A mineralizer can be also used in the form of Group II elements or their hydrides, nitrides or other oxygen-free compounds, preferably containing nitrogen and hydrogen.

It has to be noted that even though the growth rate is improved due to above described modifications of the composition of mineralizer used in the process according to the present invention, the crystalline quality of the product obtained thereby is not adversely affected, an in some instances even improved and the bulk mono-crystalline gallium-containing nitrides obtained by the process of the invention have surface dislocation density typically lower than $10^6/cm^2$, preferably lower than $10^5/cm^2$ and most preferably lower than $10^4/cm^2$. It is typical for the process according to the present invention, that even if mono-crystalline seed of a relatively poor surface quality (with dislocation density higher than $10^7/cm^2$) is used, the obtained bulk gallium-containing nitride layer may have the surface quality significantly improved, so that surface dislocation density value may even drop to $10^4/cm^2$. As mentioned above, good crystalline quality of bulk mono-crystals obtained by the process according to the present invention is additionally confirmed by the fact that the value of FWHM of the X-ray rocking curve from the plane (0002) is typically below 300 arcsec and the best obtained result was below 60 arcsec (for a Cu K α1 reflex).

The bulk mono-crystals have sufficient size and regular shape enhancing industrial use of the crystals—among others—as substrates for epitaxy in opto-electronic devices. Besides, the bulk nitride mono-crystals obtained by the process according to the present invention have high resistivity (in the case of GaN mono-crystals within a range of several Ω·cm) and good crystalline quality, as demonstrated by a low value of FWHM of the X-ray rocking curve from (0002) plane—less then 60 arcsec for a Cu K α1 beam.

Such parameters as reported above can guarantee the quality and durability of semiconductor devices made of such crystals as substrates for epitaxial layers. Because of the electrical conductivity exhibited by the product, n-type pad electrode may be deposited on the substrate.

Figure 3:
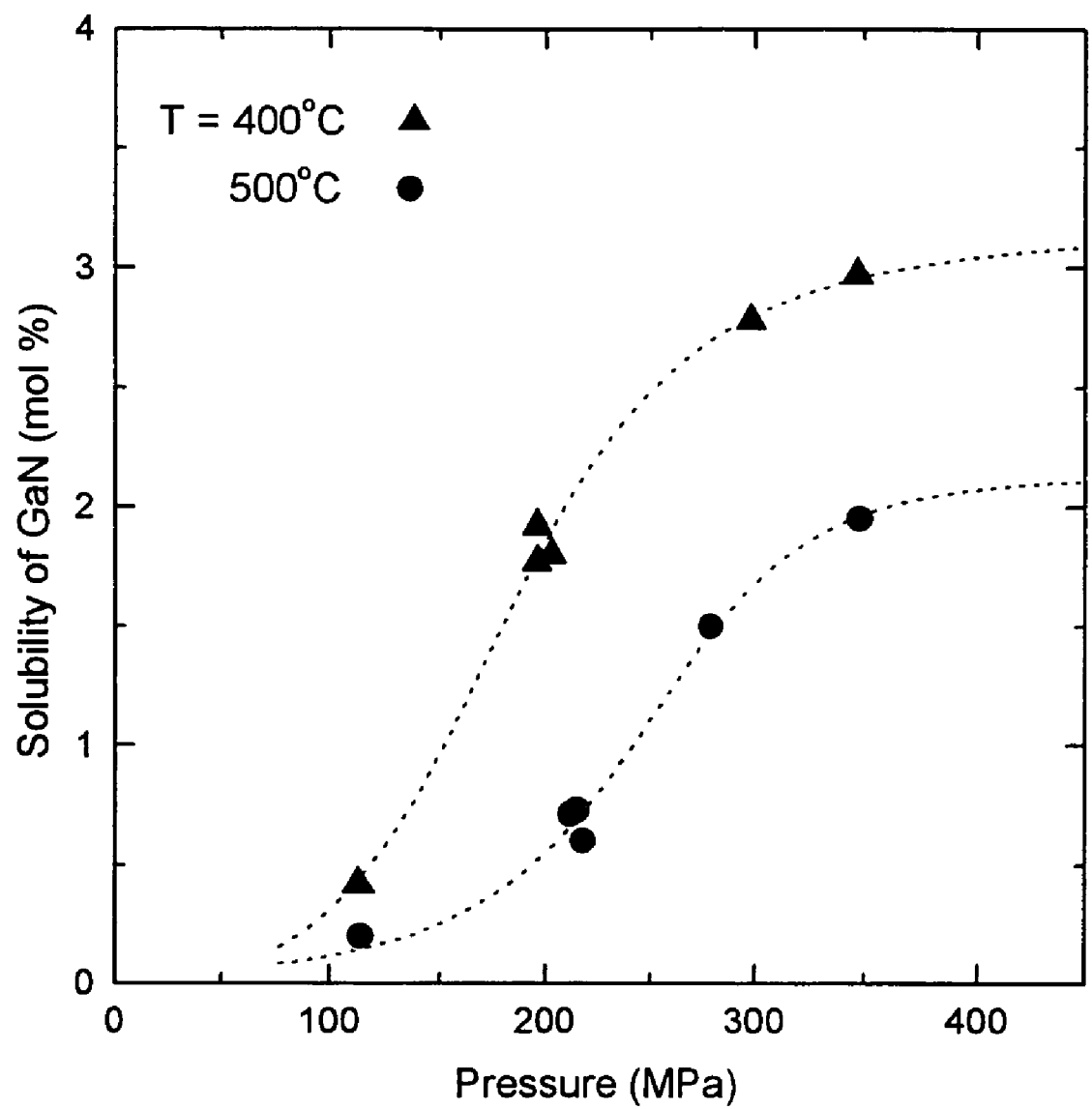
FIG. 3 shows the dependence of GaN solubility in supercritical ammonia containing potassium amide (in the molar ratio of $KNH_2:NH_3=0.07$) on pressure at temperature T=400° C. and T=500° C.

As it has been explained in details in WO 02/101120, gallium nitride exhibits good solubility in supercritical ammonia, provided that the latter contains Group I and optionally Group II elements or their compounds, such as $KNH_2$. The graph in FIG. 3 presents how solubility of GaN in supercritical ammonia-containing solution depends on pressure, for temperature 400° C. and 500° C. Here the solubility is defined as the molar percentage: $S_m \equiv [Ga N^{solution}:(KNH_2+NH_3)] \times 100\%$. In this example $KNH_2$ is used in the molar ratio of $KNH_2:NH_3=0.07$. In this case $S_m$ should be a smooth function of only three parameters:

temperature, pressure, and molar ratio of the mineralizer (i.e. $S_m=S_m(T, p, x)$). Small changes of $S_m$ can be expressed as:

$$\Delta S_m \approx (\partial S_m/\partial T)|_{p,x}\Delta T+(\partial S_m/\partial p)|_{T,x}\Delta p+(\partial S_m/\partial x)|_{T,p}\Delta x,$$

where the partial derivatives (e.g. $(\partial S_m/\partial T)|_{p,x}$) determine the behavior of $S_m$ with variation of its parameters (e.g. T). In this specification the partial derivatives are called "coefficients" (e.g. $(\partial S_m/\partial T)|_{p,x}$ is the "temperature coefficient of solubility (TCS)").

As it results form the diagram presented in FIG. 3, the solubility is a decreasing function of temperature and an increasing function of pressure. On the basis of these dependences it is possible to obtain bulk mono-crystalline gallium-containing nitride by dissolving it under higher solubility conditions and crystallizing under lower solubility conditions. Negative temperature coefficient of solubility means that in the presence of a temperature gradient the chemical transport of gallium-containing nitride occurs from lower temperature dissolution zone to higher temperature crystallization zone.

Now the solubility questions have been further explored and it has been found that in presence of potassium as mineralizer, the solubility of Group XIII element nitrides—GaN in particular—in the supercritical solvent is much higher than the solubility characteristic for sodium or lithium used as mineralizers.

To the contrary, in the presence of lithium as mineralizer the solubility of Group XIII element nitrides—GaN in particular—in the supercritical solvent is much lower than the solubility characteristic for the presence of both sodium and potassium or sodium and lithium or lithium and potassium as mineralizers.

The solubility of Group XIII element nitrides in supercritical ammonia-containing solvent is an important element in designing temperature gradient in the reaction vessel and difference of the temperature between dissolution and crystallization zones. In particular, the temperature difference between the two zones of the reaction vessel should be relatively low in order to avoid spontaneous crystallization and to ensure selective crystallization on the seeds only.

Once the soluble gallium complexes are introduced into the supercritical solution having a composition as described above in the dissolution step, according to the present invention the solution is brought into the supersaturated state by simple change of physical conditions (by increase of temperature or decrease of pressure). It is now possible to crystallize the desired bulk mono-crystalline gallium-containing nitride on seeds from supersaturated solution of soluble gallium complexes. When no other Group XIII elements are present in the solution, it is possible to obtain stoichiometric GaN on a mono-crystalline GaN seed. The deposited nitride mono-crystal may contain Group I elements in a concentration greater that 0.1 ppm since Group I element ions are present in the supercritical ammonia-containing solution. In view of maintaining the desired ammonobasic character of the supercritical ammonia-containing solution, and also in order to avoid corrosion of the reaction vessel, no halogens are intentionally introduced into the supercritical ammonia-containing solution, although some halides may be brought into the solution with starting materials, in particular with the feedstock in the form of HVPE gallium-containing nitride wafers, as well as with seeds obtained by the same method, because the seeds may be slightly dissolved in the early stage of the process.

According to the present invention, intentional replacing of 0.05 to 0.50 Ga by Al may be achieved, because of great similarity of the crystal lattice constants of the GaN and AlN, by a respective modification of the composition of the supercritical solution.

The bulk nitride crystals obtained by the process according to the present invention may be also intentionally doped with donor dopants (such as Si) and/or acceptor dopants (such a Mg, Zn) or else magnetic dopants (such as Mn and Cr) in concentrations of $10^{17}$ to $10^{21}/cm^3$. The dopants change optical, electrical and magnetic properties of the obtained gallium-containing nitride crystals.

Below, a short description of the apparatus used to carry out the process according to the present invention is provided. The apparatus is schematically presented in FIG. 4 and FIG. 5, although it has to be noticed that the inventive process can be realized in pressurized reaction vessels of different constructions as long as the principles outlined in the specification and the claims are adhered to.

The main part of the apparatus is the autoclave 1 used for bringing the solvent into a supercritical state. The autoclave is equipped with the installation 2, which enhance chemical transport in the supercritical solution within the autoclave 1. The autoclave 1 is situated in the chamber 3 of the furnace 4, equipped with heating units 5 and cooling means 6. Position of the autoclave 1 within the chamber 3 is secured by a screw blocking device 7. The furnace 4 is embedded in the bed 8 and secured with steel tapes 9 tightly wound around the furnace 4 and the bed 8. The bed 8 with the furnace 4 is pivotally mounted on the supporting base 10 and secured in the desired position by means of a pin securing device 11. By tilting the autoclave during the crystallization process it is possible to influence the convective flow and thus the chemical transport. The convective flow in the autoclave 1 placed in the furnace 4 is established by means of the installation 2 in the form of a horizontal baffle 12 of a size corresponding to not less than 70% of horizontal cross section area of the autoclave 1. The baffle 12 separates the dissolution zone 13 from the crystallization zone 14. The horizontal baffle 12 is located approximately in the middle of the autoclave 1 in terms of longitudinal dimension. Temperature values in individual zones of the autoclave 1, falling within the range from 100° C. to 800° C., are controlled by setting up respective temperature for the furnace 4 by a control unit 15. In the autoclave 1 the dissolution zone 13 corresponding to low temperature zone of the furnace 4 is situated above the horizontal baffle(s) 12. The feedstock 16 is placed in the dissolution zone 13 and the amount of the feedstock 16 is such that its volume does not exceed 50% of volume of the dissolution zone 13. Simultaneously, when metallic gallium is introduced as the feedstock 16 in crucibles, the total volume of the crucible should not exceed 80% of volume of the dissolution zone 13 and the amount of metallic gallium feedstock 16 should match the former requirement (50% of the dissolution zone volume). The crystallization zone 14 corresponds to high temperature zone of the furnace 4 and is situated below the separating baffle(s) 12. In the crystallization zone 14 the seed 17 is located and the specific position in which the seed 17 is placed is below crossing of up-stream convective flow and down-stream convective flow, but still above the bottom of the crystallization zone 14. The separating baffle(s) 12 is/are positioned within the zone of cooling means 6. As the result of cooling the baffle 12 region, the temperature difference between the dissolution zone 13 and the crystallization zone 14 may be controlled. At the level of the bottom of the crystallization zone 14 there is another cooling device 18, used in order to cool down the zone after the process is over, so that the dissolution of the grown crystal(s) during the cooling stage after the process is remarkably reduced.

The following examples are intended to illustrate the invention and should not be construed as limiting.

EXAMPLE I

Group I Element Mineralizer

The dissolution zone 13 of a 600 cm$^3$ high pressure autoclave 1 (FIG. 4-5), having the inner diameter of 40 mm and length of 480 mm, was charged with 53.0 g of feedstock in the form of metallic gallium (6N). The crystallization zone 14 of the same autoclave was charged with a seed crystal in the form of a gallium nitride wafer (having the diameter of about 1 inch and the mass of 2.0 g obtained by the HVPE method. As the mineralizer, 12.0 g of 4N metallic sodium as well as 19.5 g of 4N metallic potassium were put into the autoclave. Next, the autoclave was filled with 255.0 g of ammonia (5N), tightly closed and put into a set of furnaces 4. The temperature of the dissolution zone 13 was raised to 450° C. (at 1° C./min, FIG. 6), while the crystallization zone was not heated and its temperature did not exceed 250° C. In this way; supercritical ammonia-containing solution was obtained with the following molar ratio: $KNH_2:NH_3=0.035$; $NaNH_2:NH_3=0.035$. This temperature distribution was maintained in the autoclave for 4 days (FIG. 6), during which partial dissolution of gallium and a complete reaction of undissolved gallium to polycrystalline GaN took place.

Figure 6:
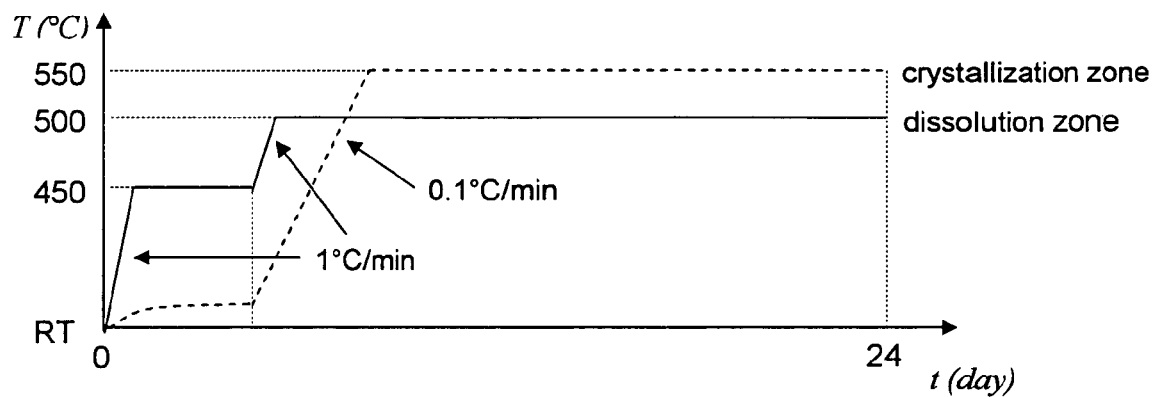
FIG. 6 presents the change of temperature in time inside the autoclave in Examples I and II.

Next, the temperature of the dissolution zone was increased to 500° C. (at 1° C./min), the temperature of the crystallization zone was slowly increased to 550° C. (at 0.1° C./min, FIG. 6), with the pressure inside the autoclave reaching about 280 MPa. The autoclave was kept under those conditions (the second step of the process) for the subsequent 20 days (FIG. 6). As a result of the process, partial dissolution of the feedstock (i.e. polycrystalline GaN) was observed in the dissolution zone and crystallization of gallium nitride on the HVPE seed took place in the crystallization zone. The gallium nitride crystallized on both sides of the seed in the form of mono-crystalline layers with the total thickness of about 2 mm.

EXAMPLE II

Use of Mineralizer Including Both Group I Element and Group II Element

The same procedures were followed as in Example I, with the only exception that instead of using 12.0 g of metallic sodium and 19.5 g of metallic potassium—39.0 g of 4N metallic potassium together with 1.2 of 3N metallic magnesium were used, and after 24 days of the process growth of bulk mono-crystalline gallium-containing nitride layers was obtained of about 2 mm.

EXAMPLE III

Use of Mineralizer Including Group I Element Azide and Other Group I Element

Figure 7:
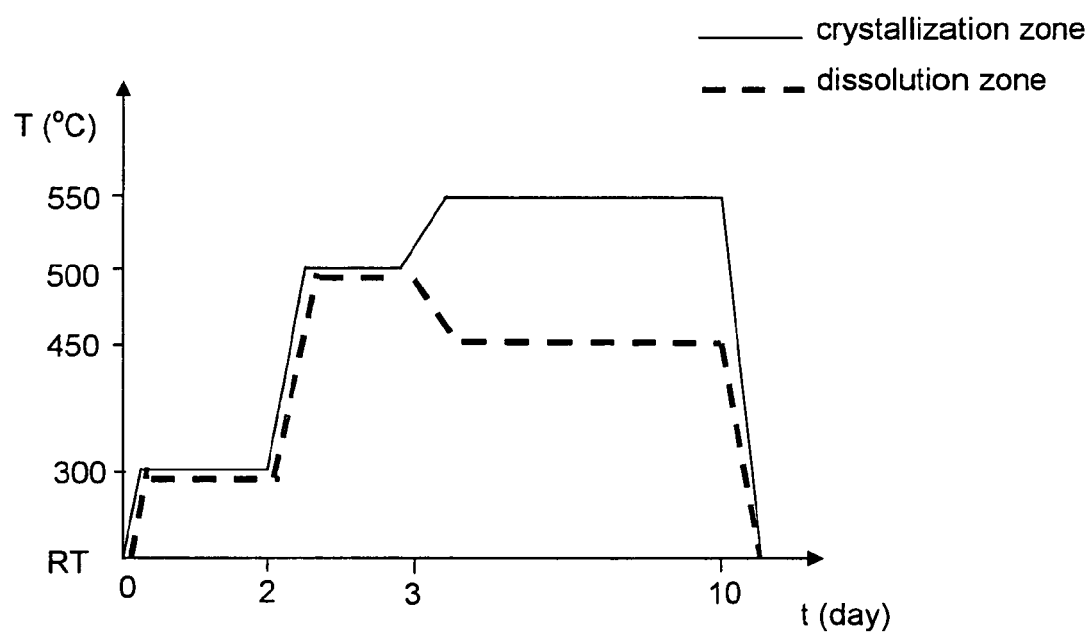
FIG. 7 presents the change of temperature in time in the autoclave in Example III.

Dissolution zone 13 of an 84 cm$^3$ high-pressure autoclave 1 (FIG. 4-5) was charged with 6.0 g of feedstock in the form of gallium nitride wafers obtained by HVPE method, each of 200 μm thickness as well as 1.05 g of 6N metallic gallium, and 0.7 g of GaN seeds obtained also by HVPE method were placed in the crystallization zone of the same autoclave. Then 4.9 g of 5N sodium azide, 2.9 g of 4N metallic potassium and 39 g of 5N ammonia were placed in the autoclave. The autoclave was closed, put into the chamber of a furnace and heated up to 300° C. This temperature was maintained inside the autoclave for the next two days. During that time the azide was decomposed and the ammonobasic solvent was produced, which enabled complete dissolution of metallic gallium. After two days the temperature in the autoclave was increased to 500° C. for one day. Then the temperature of the dissolution zone was decreased to 450° C., while the temperature of the crystallization zone was increased to 550° C. This temperature distribution inside the autoclave was maintained for another 7 days (FIG. 7). At such conditions the expected pressure within the autoclave is ca. 260 MPa. The real pressure turned out to be ca. 310 Mpa and the observed increment was the effect of gaseous nitrogen, produced during decomposition of the azide. As the result of the process, partial dissolution of the feedstock in the dissolution zone and growth of mono-crystalline gallium nitride layers on both sides of each seed in the crystallization zone was observed. The total thickness of the re-crystallized layers was ca. 700 μm.

EXAMPLE IV

Use of Mineralizer Comprising Oxygen-free Species Weakening Ammono-Basic Character of the Resultant Supercritical Ammonia-containing Solution The high-pressure autoclave 1 of the diameter of 40 mm, length of 480 mm and volume of 603 cm$^3$ (FIG. 4-5), was charged in the dissolution zone with the feedstock in the form of metallic gallium—53 g (about 750 mmol) and 6N purity, and was charged in the crystallization zone with the seed in the form of gallium nitride—at the weight of 0.74 g and diameter of 1 inch—obtained by the HVPE method. Also, 38 g (about 1000 mmol) of metallic potassium (4N) and 5 g (50 mmol) of ZnS (4N) were introduced into the autoclave. Next, the autoclave was filled with 260 g of ammonia (5N), closed and put into the set of furnaces.

Figure 8:
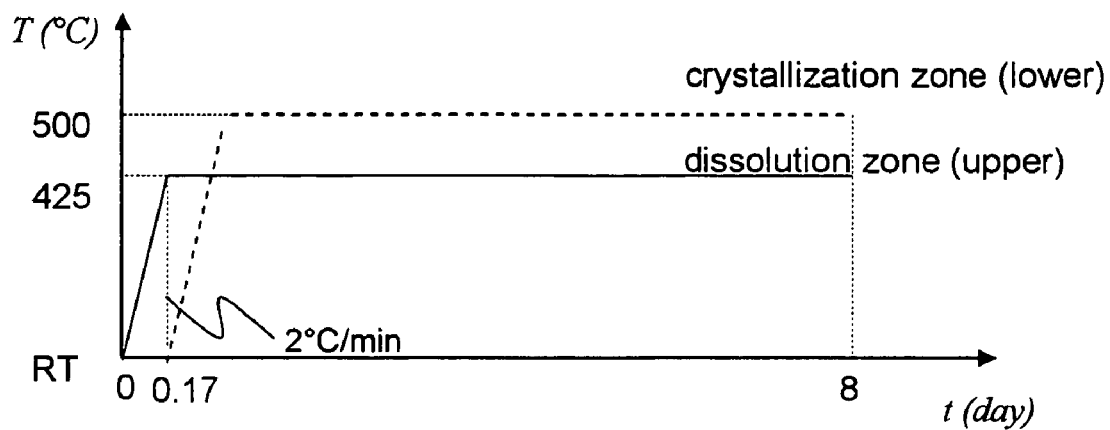
FIG. 8 presents the change of temperature in time in the autoclave in Example IV and FIG. 9 presents the change of temperature in time in the autoclave in Example V.

By heating (at 2° C./min), the temperature in the dissolution zone of the autoclave was raised to 425° C. (FIG. 8). Heating of the crystallization zone (at the rate of about 2° C./min) started when the dissolution zone attained the target temperature of 425° C./min, i.e., after the period of about 4 hours from the beginning of the process. After the next few hours temperature in the crystallization zone attained 500° C., with the pressure inside the autoclave being around 260 MPa. In this way, the supercritical ammonia-containing solution was obtained, in which the molar ratio of the mineralizer to ammonia was $KNH_2:NH_3=0.07$, whereas the molar ratio of sulfur species to ions of Group I elements was 1:20. This balance (i.e., at 425° C. in the dissolution zone and 500° C. in the crystallization zone) remained till the end of the process, i.e. for about 8 days (FIG. 8).

As a result of the process, partial dissolution of the feedstock took place in the dissolution zone and crystallization of gallium nitride on the seed took place in the form of two-sided mono-crystalline layers of the total thickness of about 510 μm.

EXAMPLE V

Use of Mineralizer in Form of a Mixture of Group I Element Azides

Figure 9:
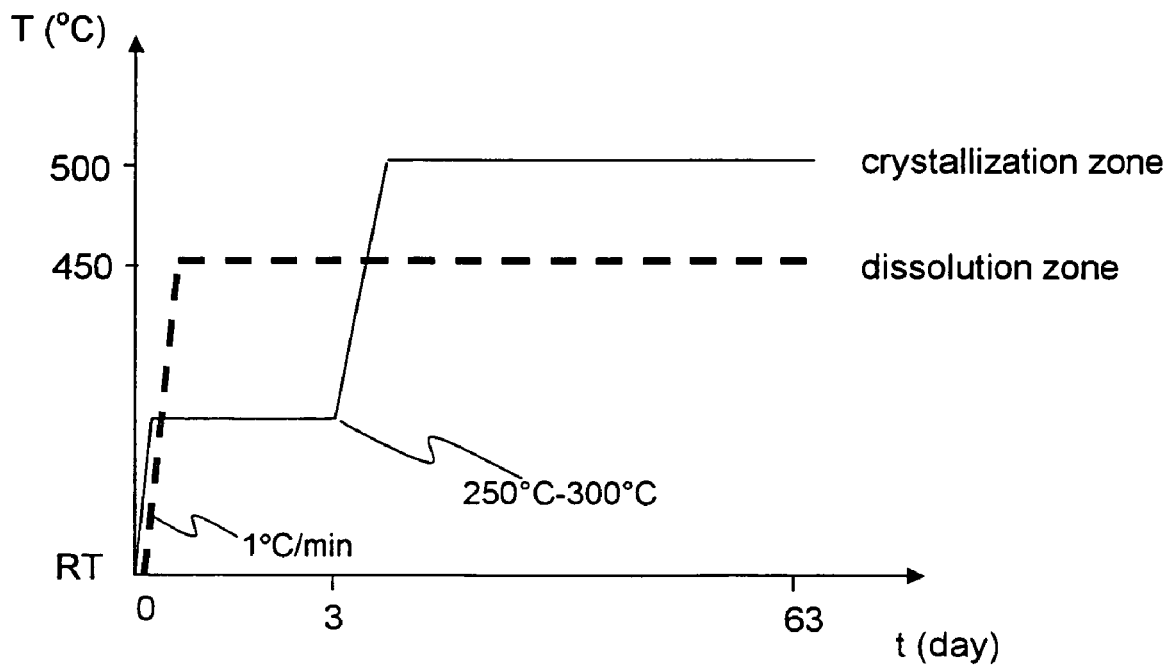

High-pressure autoclave 1 (FIG. 4-5), having the inner diameter of 40 mm, length equal to 480 mm and volume of 600 cm$^3$, was charged with 53.0 g of 6N metallic gallium in the dissolution zone 13, and 8 seeds of the diameter of 1 inch and mass of 2.0 g each in the form of GaN obtained by HVPE method were placed in the crystallization zone 14 of the same autoclave. Then 46.2 g of 5N sodium azide, 23.5 g of 5N potassium azide and 255 g of 5N ammonia were placed in the autoclave 1. The temperature in the dissolution zone of the autoclave was increased to 450° C. by (at 1° C./min), while the temperature in the crystallization zone was maintained at the level of 250° C.-300° C. (FIG. 9). This temperature distribution was maintained inside the autoclave for the next three days. During that time the azide was decomposed and the ammonobasic solvent characterized by the molar ratios of $KNH_2:NH_3=0.02$ and $NaNH_2:NH_3=0.05$ was produced. This enabled partial dissolution of metallic gallium and the reaction of all non-dissolved gallium to polycrystalline GaN. After three days the temperature in the crystallization zone was increased to 500° C. This temperature distribution inside the autoclave was maintained for another 60 days (FIG. 9). At such conditions the expected pressure within the autoclave is ca. 230 MPa. The real pressure turned out to be ca. 320 MPa and the observed increment was the effect of gaseous nitrogen, produced during decomposition of the azide. As the result of the process, partial dissolution of the feedstock (i.e. polycrystalline GaN) in the dissolution zone 13 and growth of mono-crystalline gallium nitride layers on both sides of each seed in the crystallization zone 14 was observed. The total thickness of the re-crystallized layers was ca. 5 mm.

EXAMPLE VI

Further Processing of Bulk Mono-crystalline Gallium-containing Nitride

The mono-crystals obtained in the Examples I-V were subject to the following processing, so as to obtain substrates for epitaxy:

1) The 5 mm thick mono-crystalline layer, deposited on a HVPE-GaN seed was put into a furnace and annealed for 1 to 5 hours in the nitrogen atmosphere, containing also low amount of oxygen, at temperature form 600° C. to 900° C.

2) The mono-crystalline layer was placed into the wire saw manufactured by Takatori Corp. It was positioned and sliced so that 5 wafers with the off-angle between 0.05 and 0.2 degree from the main axis of the crystal were obtained.

3) The wafers were put once more into a furnace and annealed for 1 to 5 hours in the nitrogen atmosphere, containing also low amount of oxygen, at temperature form 600° C. to 900° C. (The thus prepared samples are called GaN substrates.)

4) The GaN substrates were mounted on worktables, placed into a polishing machine manufactured by Logitech Ltd. and polished consecutively on each side. In the polishing process diamond tools as well as silica or alumina slurries (with pH from 3 to 6 or else from 9 to 11) were used. The roughness of the obtained surfaces was lower than 10 Å.

5) In the next step, the surfaces of the GaN substrates were covered with a protective layer of GaN or AlGaN, several microns thick, by means of HVPE method. Thus, template substrates were obtained. The conditions of the HVPE process were as follows: reaction temperature: 1050° C., reaction pressure: atmospheric (0.1 MPa), partial pressure of ammonia: 0.03 MPa, partial pressure of $GaCl_3$: 100 Pa, carrier gas: hydrogen.

6) Optionally, on a GaN template with the protective layer (as described in step 5) or on a GaN template without the protective layer, another layer of GaN—3 mm thick—was produced by the HVPE method. After cutting and polishing according to the aforementioned procedure the substrates of thickness of 0.5 mm, suitable as substrates for opto-electronic devices, were obtained.

The above examples are intended to illustrate preferred embodiments of the process according to the present invention. Further modifications of the process can easily be designed by skilled artisans and such modifications are intended to be included within the scope of the present invention as defined in the appended claims.

The preferred embodiments according to the present invention are as follows.

1. The process for obtaining bulk mono-crystalline gallium-containing nitride in the supercritical ammonia-containing solvent with mineralizer addition, characterized in that a supercritical ammonia-containing solvent, containing ions of Group I element (IUPAC 1989), preferably sodium and:
   (a) ions of another Group I element (IUPAC 1989), or
   (b) ions of Group II element (IUPAC 1989), preferably calcium or magnesium, or
   (c) one or more substances containing oxygen-free species causing a weakening of the ammono-basic nature of the supercritical solvent, or else
   (d) ions of Group II element (IUPAC 1989), preferably calcium or magnesium and one or more substances containing oxygen-free species causing a weakening of the ammono-basic nature of the supercritical solvent is obtained in the autoclave and then this solvent is used for dissolution of the gallium-containing feedstock, and crystallization of the gallium-containing nitride is obtained from the supercritical solution on the surface of the seed at the temperature higher and/or pressure lower than that of dissolution of the feedstock.

2. The process of obtaining bulk mono-crystalline gallium-containing nitride, characterized in that the gallium containing nitride has a negative temperature coefficient of solubility in the supercritical ammonia-containing solvent obtained in the autoclave with the use of Group I element (IUPAC 1989), preferably sodium and:
   (a) ions of another Group I element (IUPAC 1989), or
   (b) ions of Group II element (IUPAC 1989), preferably calcium or magnesium, or
   (c) one or more substances containing oxygen-free species causing a weakening of the ammono-basic nature of the supercritical solvent, or else
   (d) ions of Group II element (IUPAC 1989), preferably calcium or magnesium and one or more substances containing oxygen-free species causing a weakening of the ammono-basic nature of the supercritical solvent which is used for dissolution of the gallium-containing feedstock, two temperature zones are created within the autoclave, the feedstock is put in the dissolution zone, while at least one mono-crystalline seed is placed in the crystallization zone, and then, at least in the autoclave zone, wherein the seed was placed, supersaturation of the solution with respect to the seed occurs as a result of proper increasing temperature of said zone and crystallization of the gallium-containing nitride is carried out on the surface of the seed through control of concentration at the level at which spontaneous crystallization is negligible.

3. The process according to claim 1 or 2, characterized in that said supercritical ammonia-containing solvent is obtained with the use of sodium and another Group I element (IUPAC 1989) as mineralizers and the molar ratio of ions of sodium to ions of other Group I element (IUPAC 1989) is from 1:10 to 10:1.

4. The process according to claim 1 or 2, characterized in that the supercritical ammonia-containing solvent contains ions of Group I element (IUPAC 1989) and ions of Group II element (IUPAC 1989) as mineralizers and the molar ratio of Group II element (IUPAC 1989) to the Group I element (IUPAC 1989), introduced together, ranges from 1:500 to 1:5, more preferably from 1:100 to 1:20.

5. The process according to claim 1 or 2, characterized in that said oxygen-free species contain sulfur.

6. The process according to any one of the preceding claims 1 to 5, characterized in that said Group I elements are selected from the group consisting of sodium, potassium and lithium.

7. The process according to any one of the preceding claims 1 to 6, characterized in that said Group I elements are introduced to the supercritical ammonia-containing solvent in the form of azides.

8. The process according to any one of the preceding claims 1 to 7, characterized in that the gallium-containing nitride has the general formula of $Al_xGa_{1-x}N$, where $0 \leq x < 1$.

9. The mineralizer used for a process for obtaining bulk mono-crystalline gallium-containing nitride in a supercritical ammonia-containing solvent, which comprises
 (a) Group I element (IUPAC 1989), or
 (b) Group II element (IUPAC 1989), preferably calcium or magnesium, or
 (c) $(NH_4)_2S$, $(NH_4)HS$ and $(NH_4)_2S_5$

The invention claimed is:

1. A mineralizer used for a process for obtaining bulk mono-crystalline gallium-containing nitride in a supercritical ammonia-containing solvent which provides:
 (a) ions of another Group I element (IUPAC 1989), or
 (b) ions of Group II element (IUPAC 1989), preferably calcium or magnesium, or
 (c) one or more substances containing oxygen-free species causing a weakening of the ammono-basic nature of the supercritical solvent, or else
 (d) ions of Group II element (IUPAC 1989), preferably calcium or magnesium and one or more substances containing oxygen-free species causing a weakening of the ammono-basic nature of the supercritical solvent in a supercritical ammonia-containing solvent for dissolution of the gallium-containing feedstock.

2. A mineralizer according to claim 1, which is able to provide the gallium containing nitride with a negative temperature coefficient of solubility in the supercritical ammonia-containing solvent.

3. A mineralizer according to claim 1, which comprises sodium and another Group I element (IUPAC 1989) and the molar ratio of ions of sodium to ions of other Group I element (IUPAC 1989) is from 1:10 to 10:1.

4. A mineralizer according to claim 1, which comprises ions of Group I element (IUPAC 1989) and ions of Group II element (IUPAC 1989) and the molar ratio of Group II element (IUPAC 1989) to the Group I element (IUPAC 1989), ranges from 1:500 to 1:5, more preferably from 1:100 to 1:20.

5. A mineralizer according to claim 1, wherein said oxygen-free species contain sulfur.

6. A mineralizer according to claim 1, which comprises said Group I elements selected from the group consisting of sodium, potassium and lithium.

7. A mineralizer according to claim 1, wherein said Group I elements are in the form of azides.

8. A mineralizer according to claim 1, which further comprises acidic mineralizer containing sulfur or halogen.

9. A mineralizer according to claim 8, wherein said mineralizer is selected form the group consisting of sulphides such as $(NH_4)_2S$, $(NH_4)HS$ and $(NH_4)_2S_5$.

* * * * *